(12) United States Patent

Ngai et al.

(10) Patent No.: US 10,236,838 B2
(45) Date of Patent: Mar. 19, 2019

(54) MULTI-POWER AMPLIFICATION

(71) Applicant: QUALCOMM Incorporated, San Diego, CA (US)

(72) Inventors: Wai Lim Ngai, Poway, CA (US); Jeremy Goldblatt, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/424,603

(22) Filed: Feb. 3, 2017

(65) Prior Publication Data

US 2018/0226924 A1    Aug. 9, 2018

(51) Int. Cl.
| | |
|---|---|
| *H03F 3/21* | (2006.01) |
| *H03F 1/02* | (2006.01) |
| *H03F 3/19* | (2006.01) |
| *H03F 3/72* | (2006.01) |

(52) U.S. Cl.
CPC ............ *H03F 3/21* (2013.01); *H03F 1/0205* (2013.01); *H03F 1/0277* (2013.01); *H03F 3/19* (2013.01); *H03F 3/211* (2013.01); *H03F 3/72* (2013.01); *H03F 2200/294* (2013.01); *H03F 2200/451* (2013.01)

(58) Field of Classification Search
USPC ............... 330/295, 124 R, 84, 286, 310, 165
See application file for complete search history.

(56) References Cited

U.S. PATENT DOCUMENTS

| | | | | |
|---|---|---|---|---|
| 4,153,882 A | * | 5/1979 | Fisher | H03F 3/2178 327/106 |
| 7,129,784 B2 | | 10/2006 | Bhatti et al. | |
| 7,183,841 B2 | * | 2/2007 | Fenk | H03F 3/211 330/285 |
| 7,872,528 B2 | * | 1/2011 | Bockelman | H03F 1/3211 330/124 R |
| 7,944,296 B1 | | 5/2011 | Lee et al. | |
| 8,929,945 B1 | * | 1/2015 | Wei | H04B 1/0057 330/165 |
| 8,975,961 B2 | * | 3/2015 | Joshi | H03G 1/00 330/127 |
| 2005/0186919 A1 | | 8/2005 | Kobayashi et al. | |
| 2009/0273397 A1 | | 11/2009 | Bockelman et al. | |
| 2014/0085006 A1 | | 3/2014 | Mostov et al. | |
| 2015/0070097 A1 | | 3/2015 | Bauer et al. | |

FOREIGN PATENT DOCUMENTS

| | | |
|---|---|---|
| CN | 203108108 U | 7/2014 |
| WO | 2014190344 A1 | 11/2014 |

OTHER PUBLICATIONS

Chowdhury, D., Hull, C. D., Degani, O. B., Wang, Y., & Niknejad, A. M. (Dec. 12, 2009). A Fully Integrated Dual-Mode Highly Linear 2.4 GHz CMOS Power Amplifier for 4G WiMax Applications. IEEE Journal of Solid-State Circuits, 44(12), 3393-3402.
International Search Report and Written Opinion—PCT/US2018/013792—ISA/EPO—dated Jun. 19, 2018.

* cited by examiner

*Primary Examiner* — Hieu P Nguyen
(74) *Attorney, Agent, or Firm* — Hunter Clark PLLC

(57) ABSTRACT

An amplification circuit includes: an input stage including a driver; a transformer that includes a primary winding and a secondary winding, the primary winding being coupled to an output of the driver; and an output stage including: an output configured to be coupled to a load; and a plurality of paths coupled to the output and coupled to respective taps of the secondary winding; where at least one of the plurality of paths comprises a power amplifier.

25 Claims, 6 Drawing Sheets

MULTI-POWER AMPLIFICATION

BACKGROUND

Wireless communications systems are increasingly popular. For example, cellular communications and Wi-Fi communications systems continue to increase in popularity. Further, as demand for services have increased, different technologies have been developed to meet these needs, with the different technologies providing different types of service (e.g., long range versus short range, different capacities (e.g., abilities to service more users and/or transfer data at higher rates), different quality (e.g., different abilities to provide quality communications in noisy environments), etc. Often different power amounts are used for transmitting communication signals, e.g., to base stations that are different distances from a transmitter, variation in a propagation channel, or different power requirements of different technologies. Maintaining efficiency of a power amplifier for different power amounts may be difficult.

SUMMARY

An example of an amplification circuit includes: an input stage including a driver; a transformer that includes a primary winding and a secondary winding, the primary winding being coupled to an output of the driver; and an output stage including: an output configured to be coupled to a load; and a plurality of paths coupled to the output and coupled to respective taps of the secondary winding; where at least one of the plurality of paths comprises a power amplifier.

Implementations of such an amplification device may include one or more of the following features. The plurality of paths comprises: a first path coupled to the secondary winding at a first tap, the first path including the power amplifier; and a second path coupled to the secondary winding at a second tap, the second path being configured to couple the second tap directly to the output; where there is less of the secondary winding between the second tap and a last terminal of the secondary winding than between the first tap and the last terminal of the secondary winding. The power amplifier is a first power amplifier, the output stage further comprises a third path coupled to the secondary winding at a third tap, the third path includes a second power amplifier, and there is less of the secondary winding between the first tap and the last terminal of the secondary winding than between the third tap and the last terminal of the secondary winding. The output stage further comprises a third path coupled to the secondary winding at a third tap, the third path being configured to couple the third tap directly to the output, and wherein there is less of the secondary winding between the third tap and the last terminal of the secondary winding than between the second tap and the last terminal of the secondary winding.

Also or alternatively, implementations of the example of an amplification device may include one or more of the following features. The output stage further comprises an output-matching circuit coupled between the power amplifier and the output, or coupled between the secondary winding and the power amplifier. The driver is a CMOS driver and the output stage comprises GaAs. The output stage is configured to couple only one of the respective taps to the output at a time. The driver is configured to provide a selectable power to the primary winding of the transformer such that a single path is provided between an input of the driver and the primary winding of the transformer for a plurality of different selectable output powers of the driver. The driver comprises an impedance matching circuit coupled to the driver and disposed in the single path between the input of the driver and the primary winding of the transformer. The driver comprises a plurality of selectable amplifier cells and the driver is configured to selectively activate one or more of the plurality of selectable amplifier cells to provide each of the different selectable output powers. At least one of plurality of paths is implemented at least in part by a portion of a multiplexer. The amplification circuit further includes a variable capacitor coupled to an output of the driver and to a feed terminal of the primary winding.

Another example of an amplification circuit includes: driving means for providing drive energy; a transformer that includes a primary winding and a secondary winding, the primary winding being coupled to the driving means to receive the drive energy; and coupling means for selectively coupling the secondary winding to an output that is configured to be coupled to a load, the coupling means comprising a plurality of paths each configured to selectively couple a respective tap, of a plurality of taps of the secondary winding, to the output, at least one of the paths including amplifying means for amplifying energy from the secondary winding.

Implementations of such an amplification device may include one or more of the following features. The plurality of paths includes: a first path coupled to the secondary winding at a first tap of the plurality of taps, the first path including the amplifying means; and a second path coupled to the secondary winding at a second tap of the plurality of taps, the second path being configured to couple the second tap directly to the output; where there is less of the secondary winding between the second tap and a last terminal of the secondary winding than between the first tap and the last terminal of the secondary winding. The amplifying means are first amplifying means and the coupling means further include a third path coupled to the secondary winding at a third tap of the plurality of taps, the third tap being distinct from the first tap and the second tap, and the third path including second amplifying means for amplifying energy from the secondary winding. The coupling means further include a third path coupled to the secondary winding at a third tap of the plurality of taps, the third tap being distinct from the first tap and the second tap, the third path being configured to couple the second tap directly to the output, and there is less of the secondary winding between the third tap and the last terminal of the secondary winding than between the first tap and the last terminal of the secondary winding. The coupling means include means for matching an output coupled between the amplifying means and the output or between the first tap of the secondary winding and the amplifying means.

Also or alternatively, implementations of the another example of an amplification device may include one or more of the following features. The coupling means are for coupling only one of the plurality of taps to the output at a time. The driving means include a CMOS driver and the coupling means comprise GaAs. The driving means are for providing the drive energy with a selectable power to the primary winding of the transformer such that a single path is provided between an input of the driving means and the primary winding of the transformer for a plurality of different selectable output powers. The driving means include means for matching an disposed in the single path between the input of the driving means and the primary winding of the transformer.

An example of a method of providing a signal to a load includes: receiving a radio-frequency signal as a first signal; amplifying the first signal to produce a second signal; coupling the second signal through a transformer to produce a third signal in a secondary winding of the transformer, the secondary winding comprising a plurality of taps at different locations; and conveying the third signal through a selected path of a plurality of paths from the secondary winding of the transformer to an output, each of the plurality of paths corresponding to a respective tap of the plurality of taps and at least one of the plurality of paths comprising a power amplifier.

Implementations of such method may include one or more of the following features. The method further includes amplifying the third signal with the power amplifier to produce a fourth signal. The method further includes processing the fourth signal in an output-matching circuit to produce a fifth signal, and providing the fifth signal to the output. Amplifying the first signal includes amplifying the first signal using a selected set of a plurality of driver amplifier cells to produce the second signal.

DETAILED DESCRIPTION

Figure 1:
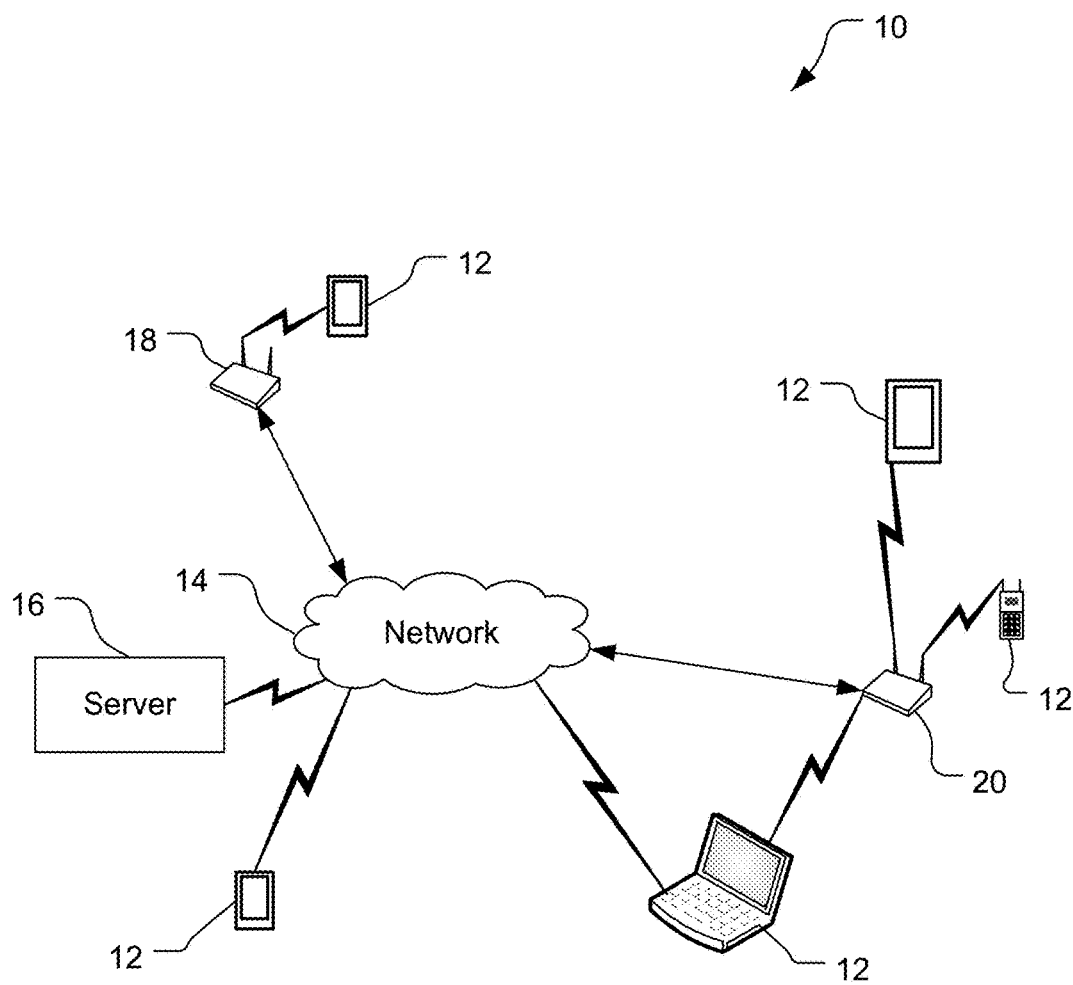
FIG. 1 is a schematic diagram of a communication system.

Techniques are discussed herein for providing different power levels to a load. For example, a transmitter (for example for a wireless communication system) includes a driver connected to a primary winding of a transformer. A secondary winding of the transformer is a multi-tap winding with multiple taps each at a different point along the secondary winding. Each tap may correspond to one power mode, e.g., to facilitate different impedance transformations to that may help (e.g., achieve highest) efficiency at each power mode. The different taps may be connected to different paths to an output of the transmitter. The transmitter may be configured to selectively connect one tap at a time to the output of the transmitter, and to connect each tap to a respective path to the output. Alternatively, the transmitter may be configured to connect one or more of the taps to multiple paths (e.g., one through an amplifier and another through a different amplifier or through no amplifier at all) to the transmitter output. The driver for the primary winding of the transformer may have multiple selectable configurations to provide a selectable amount of power to the primary winding through a single path.

Items and/or techniques described herein may provide one or more of the following capabilities, as well as other capabilities not mentioned. Multiple transmission modes providing different transmission powers may be provided using a single secondary winding of a transformer, thus saving complexity and space of using multiple secondary windings. Different turn ratios may be provided even with limited thick metal layers limiting the stacking of coils. Different impedances may be presented to one or more active devices depending upon a power mode. Power for one or more low-power modes may be provided without using a power amplifier to amplify power from a transformer. Different voltage swings may be provided to one or more power amplifiers for different power modes. Voltage stresses of switches may be maintained within manageable levels. A transformer with a high coupling coefficient may be used in a transmitter that provides multiple selectable output powers. A tuning capacitor may be used on only a primary winding of a transformer in a transmitter to tune the transmitter. Tapping points of a multi-tap winding of a transformer may be established for desired, and possibly optimal, layout distribution of the taps and/or high-precision desired turn ratios. A series switch between a driver amplifier and an inter-stage matching device may be avoided, thereby avoiding loss and avoiding linearity degradation. Transmitters as discussed may be implemented as either on-chip or laminate transmitters. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

Referring to FIG. 1, a communication system 10 includes mobile devices 12, a network 14, a server 16, and access points (APs) 18, 20. The system 10 is a communication system in that components of the system 10 can communicate with one another directly or indirectly, e.g., via the network 14 and/or one or more of the access points 18, 20 (and/or one or more other devices not shown, such as one or more base transceiver stations). For indirect communications, the communications may be altered during transmission from one entity to another, e.g., to alter header information of data packets, to change format, etc. The example mobile devices 12 shown include mobile phones (including smartphones), a laptop computer, and a tablet computer. Still other mobile devices may be used, whether currently existing or developed in the future.

Figure 2:
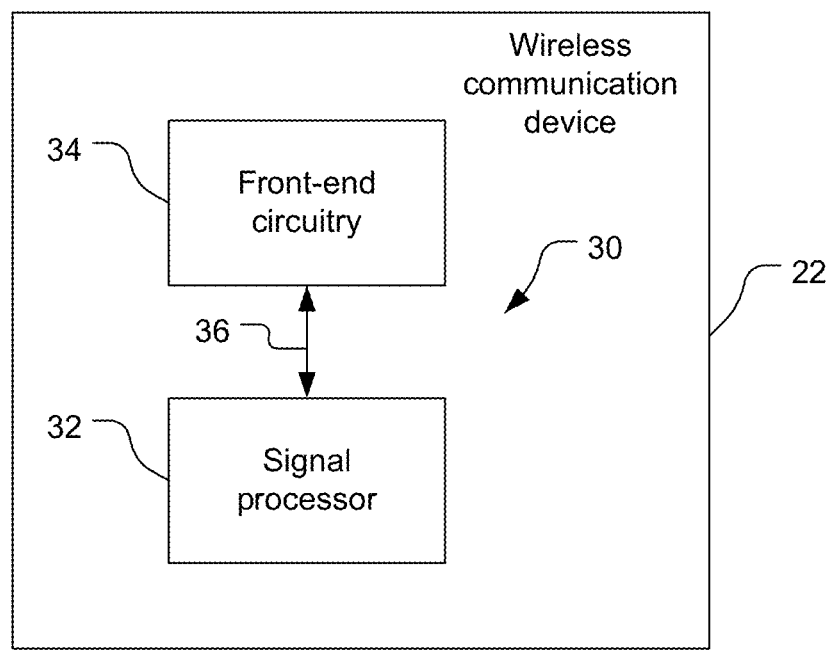
FIG. 2 is a block diagram of components of a wireless communication device shown in FIG. 1.

Referring also to FIG. 2, an example of a wireless communication device 22 includes a signaling system 30 that includes a signal processor 32 and front-end circuitry 34. The front-end circuitry 34 is communicatively coupled to the signal processor 32 by one or more transmission lines 36. The signal processor 32 and the front-end circuitry 34 may provide multiple signal chains that may be used, for example, to communicate in different networks and/or for different purposes (e.g., Wi-Fi communication, multiple frequencies of Wi-Fi communication, satellite positioning, one or more types of cellular communications (e.g., GSM (Global System for Mobiles), CDMA (Code Division Multiple Access), LTE (Long-Term Evolution), etc.). In accordance with the disclosure, the front-end circuitry 34 is configured to provide different output powers using a transformer that has a single primary winding and a single secondary winding from which there are multiple taps.

The signal processor 32 is configured to send communication signals to, and to receive communication signals from, the front-end circuitry 34. The signal processor 32 is configured to produce an outbound communication signal, for example in a baseband, and to send this signal to a transmitter of the front-end circuitry 34 via the transmission line(s) 36. The communication signal provides appropriate information, e.g., outgoing voice, uploading data, etc. for transmission by the front-end circuitry 34, e.g., to a cellular tower, and access point, etc. The signal processor 32 is further configured to receive an inbound communication signal from a receiver of the front-end circuitry 34 via the transmission line(s) 36.

Figure 3:
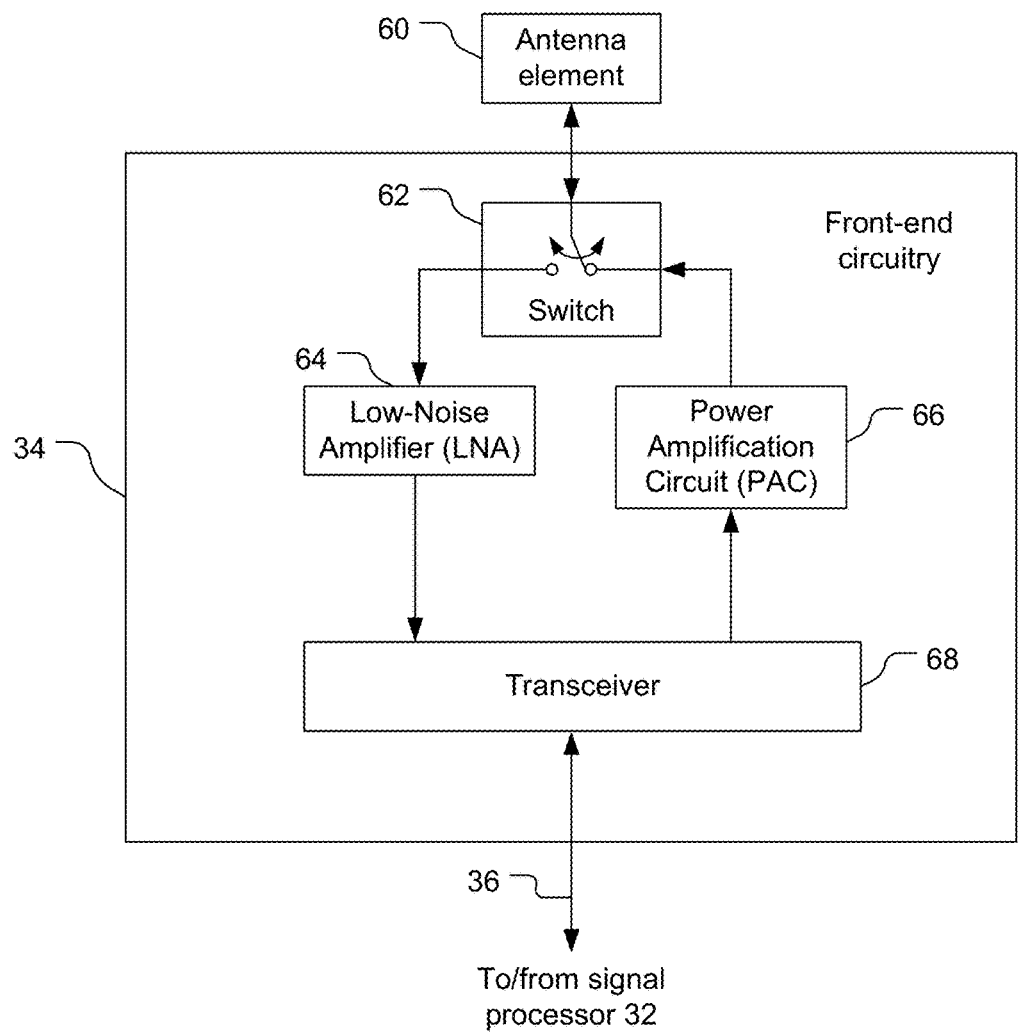
FIG. 3 is a block diagram of components of the front-end circuitry shown in FIG. 2.

Referring to FIG. 3, with further reference to FIGS. 1-2, the front-end circuitry 34 has an antenna element 60, an interface switch 62, a low-noise amplifier (LNA) 64, a power amplification circuit 66, and a transceiver 68. The components of the front-end circuitry 34 shown may be integrated into a single unit disposed in a single housing, for example in a transceiver module and/or front-end module. In some embodiments, the transceiver 68 is implemented in an integrated circuit (IC) and the other components of the front-end circuitry 34 are implemented as discrete components or as modules separate from the transceiver IC.

The front-end circuitry 34 is configured to receive outbound communication signals from the signal processor 32, amplify these signals in the power amplification circuit 66, provide the amplified signals to the antenna element 60 via the switch 62, and wirelessly transmit the amplified signals via the antenna element 60. Further, the front-end circuitry 34 is configured to receive inbound RF communication signals wirelessly via the antenna 60, provide these signals via the switch 62 to the LNA 64 that amplifies these signals, and provide the amplified inbound signals to the transceiver 68 that is configured to provide these signals to the signal processor 32. In some embodiments, the transceiver 68 is configured to upconvert signals from baseband to radio frequency (RF) for transmission and/or to downconvert RF signals to baseband for provision to the signal processor 32. The transmission line 36 is coupled to the transceiver 68 to convey inbound communication signals received from the transceiver 68 to the signal processor 32 and to provide outbound communication signals received from the signal processor 32 to the transceiver 68 that is configured to provide the outbound communication signals to the power amplification circuit 66. In some embodiments, the LNA 64 is incorporated in the transceiver 68. In other embodiments, an additional LNA is implemented in the transceiver 68. While not illustrated in FIG. 3, any number of other components might be implemented in the front-end circuitry 34. For example, filters and/or matching circuits may be implemented between any of the components illustrated in FIG. 3.

While only one antenna element 60 is shown, the front-end circuitry 34 may include more than one antenna element 60. If the front-end circuitry 34 includes more than one antenna element 60, then the transceiver includes appropriate circuitry to route amplified signals from the power amplification circuit 66 to an appropriate antenna element 60. For example, the front-end circuitry 34 may include a multiplexer to route an outbound signal from the switch 62 to the appropriate antenna element 60, e.g., based on the frequency and/or power of the outbound signal. This same circuitry may be configured to route an inbound signal from one of the antenna elements 60 to the switch 62. Further, more than one of any of the other components illustrated in the front-end circuitry 34 may be implemented. These components may support additional transmit and/or receive chains, multiple-in and/or multiple-out processing, diversity reception, carrier aggregation, reception and/or transmission modes, and/or other functions or advantages.

The LNA 64 is configured to receive inbound RF communication signals from the switch 62 and to amplify the received inbound RF communication signals. The LNA 64 is configured to receive an inbound RF communication signal from the switch 62, to amplify this received signal to produce an amplified inbound signal, and to convey (provide or send) the amplified inbound signal to the transceiver 68. The LNA 64 is configured to amplify the inbound RF communication signal while the LNA 64 is enabled.

The power amplification circuit 66 is configured to receive outbound RF communication signals from the transceiver 68 and to amplify the received outbound RF communication signals. The power amplification circuit 66 is configured to receive an outbound RF communication signal from the transceiver 68, to amplify this received signal to produce an amplified outbound signal, and to convey (provide or send) the amplified outbound signal to the switch 62. The power amplification circuit 66 is configured to provide different powers to the switch 62 based on a power mode (which may correspond to a communication mode) of the front-end circuitry 34.

Figure 4:
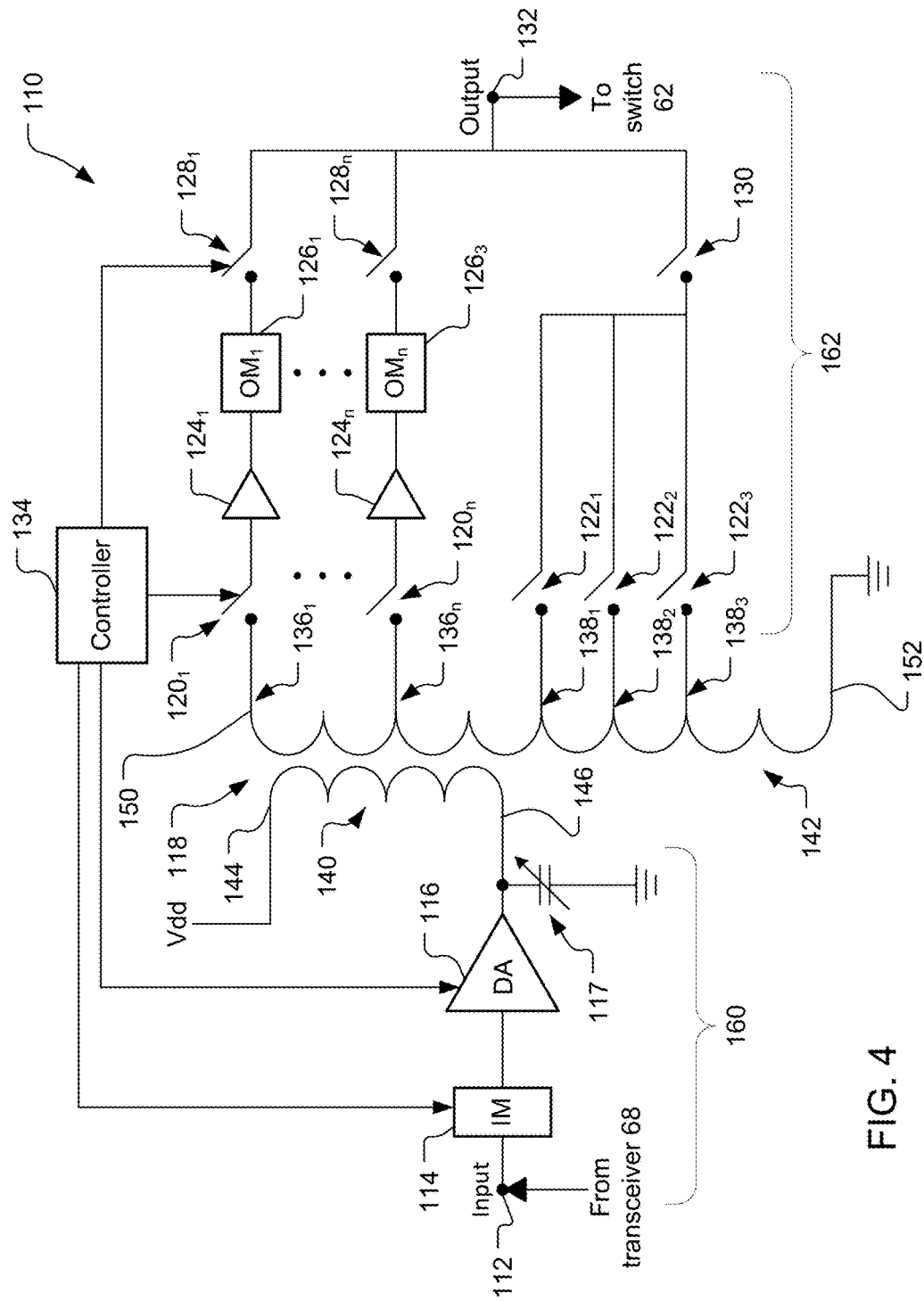
FIG. 4 is a block diagram of components of an example of a power amplification circuit shown in FIG. 3.

Referring to FIG. 4, a power amplification circuit 110, which is an example of the power amplification circuit 66 of the front-end circuitry 34, includes an input 112, an impedance matching circuit 114 (IM), a driver amplifier 116 (DA), a variable capacitor 117, a transformer 118, input mode switches 120, 122, power amplifiers 124 (PAs), output-matching circuits 126 (OM), output mode switches 128, 130, an output 132, and a controller 134. The input 112, the IM 114, the DA 116, and the variable capacitor 117 are parts of an input stage 160, and the switches 120, 122, the PAs 124, the OMs 126, the output mode switches 128, and the output 132 are parts of an output stage 162. The output stage 162 includes multiple paths linking taps of the transformer 118 to the output 132, with respective paths including a power amplifier and an output-matching circuit, or directly linking a respective tap to the output 132 (e.g., using a switch). The terms "input stage" and "output stage" are labels only and it is arbitrary what components are considered part of the input stage 160 or the output stage 162. For example, an output stage could be considered not to include the switches 120, 122. The amplification circuit 110 is configured to provide different impedances to different PAs 124 for different power modes, e.g., to help with the efficiency of each PA 124 to attempt to maximize voltage swing while avoiding voltage clipping by the supply headroom to preserve linearity. The DA 116 can provide different amounts of power to the transformer 118 and the different turn ratios provided by the different switches 120, 122 connected to different taps 136, 138 of the transformer 118 result in different voltage and current ratios and different matching impedances presented (provided) to the DA 116. Here, connecting the tap $138_1$ to the output 132 will provide a medium-power signal amplitude by passive impedance transformation, connecting the tap $138_2$ to the output 132 will provide a low-power signal amplitude by passive impedance transformation, connecting the tap $138_3$ to the output 132 will provide an ultra-low-power signal amplitude, with ultra-low power, by passive impedance transformation, with the three passive impedance transformations being different due to the different tap positions (and thus turns ratios as discussed further below). The controller 134 is communicatively coupled to the DA 116, the variable capacitor 117, and the switches 120, 122, 128 to control these components as discussed herein, e.g., to select a drive power, to tune a frequency, or to couple a tap 136, 138 to, or to decouple or isolate a tap 136, 138 from, the output 132. While the controller 134 is illustrated as being implemented in the power amplifier circuit 110 (e.g., within the circuit 66), the controller 134 may be implemented in another portion of the device 22. For example, the controller 134 may be implemented in the transceiver 68 or in the signal processor 32, for example in a baseband processor or chip. Functions of the controller 134 are described with respect to a single controller herein for ease of explanation, but such functions may be distributed among several controllers.

The IM 114 is an impedance matching circuit configured to provide a desirable impedance to the input of the DA 116. The IM 114 may provide a selectable impedance, that is selectable by the controller 134, that may match an input impedance of the DA 116. The DA 116 may have different input impedances based on amounts of power provided by the DA 116, and thus different power configurations of the DA 116.

The DA 116 is a driver of the transformer 118 and is preferably configured to have a power path with selectable different power configurations to provide different selectable amounts of power (different strengths of drive energy) to the transformer 118. For example, the DA 116 may have multiple, e.g., eight, selectable amplifier cells that each may be turned on or off. The cells may each individually provide the same amplification and/or one or more of the cells may provide different amplification than one or more of the other cells. In response to a control signal from the controller 134, the DA 116 may respond by having a single cell or a combination of cells turned on, with each different power configuration (i.e., either single cell turned on or combination of cells turned on) providing a different amount of power output from the DA 116 to the transformer 118 through a single path, e.g., a path that does not require multiple DAs. Each different power configuration may also produce a different input impedance for the DA 116. A capacitance of the variable capacitor 117 may be adjusted, e.g., by the controller 134, to tune a frequency response of the transformer 118 and thus an overall frequency response by the amplification circuit 110.

The transformer 118 is a multi-tap transformer having a primary winding 140 and a secondary winding 142 that is a multi-tap winding. A positive terminal 144 of the primary winding 140 is coupled to a voltage supply, that provides a bias voltage Vdd, and a last terminal 146 of the primary winding 140 is coupled to the output of the DA 116. Here, the last terminal 146 is also coupled to the variable capacitor 117 to ground. The secondary winding 142 is a multi-tap winding with multiple taps 136 coupled to the secondary winding 142, which is a single winding, between a positive terminal 150 and a last terminal 152. The terminals 150, 152 are respective locations of the secondary winding 142 but do not require any particular physical configuration, e.g., a connector, and neither of the terminals 150, 152 is necessarily an end of the secondary winding 142. The last terminal 152 may be coupled to ground or to a negative side of a load coupled to the output 132 to provide a differential drive of the load (e.g., the switch 62 and the antenna element 60 shown in FIG. 3).

The taps 136, 138 are connected to respective positions along the secondary winding 142 such that each tap 136, 138 is connected a different distance from the last terminal 152 and provides a different turn ratio between the primary winding 140 and the portion of the secondary winding from the last terminal 152 to the respective tap 136, 138. As shown, the tap $136_n$ is closer (measured along a length of the secondary winding 142) to the last terminal 152 than the tap $136_1$ and thus use of the tap $136_n$ provides a lower turn ratio of the used portion of the secondary winding 142 to the primary winding 140 than use of the tap $136_1$. Also as shown, the tap $138_3$ is closer to (has a shorter length relative to) the last terminal 152 than the tap $138_1$ and thus use of the tap $138_3$ provides a lower turn ratio of the used portion of the secondary winding 142 to the primary winding 140 than use of the tap $138_1$. (i.e., a length of the secondary winding 142 from the tap $138_1$ to the last terminal 152 is greater than a length of the secondary winding 142 from the tap $138_3$ to the last terminal 152). That is, the use of a higher-numbered subscripted tap 136, 138 provides lower turn ratio. Higher turn ratios correspond to higher power delivered to the output stage 162. The turn ratios of used turns in the secondary winding 142 to turns in the primary winding 140 for higher-power and lower-power modes correspond to the use of the taps $136_1$, $138_1$. The taps $138_1$, $138_2$, $138_3$ correspond, for example, to a medium-power mode (MPM), a low-power mode (LPM), and an ultra-low-power mode (ULPM). As the turns ratios are proportional to power levels, voltage stress in any of the switches 120, 122 that is not in use is manageable. The tap $136_1$ provides the highest turn ratio for the power amplification circuit 110 and is positioned such that the number of turns will result in meeting a matching requirement of the DA 116 to the output stage 162. The DA 116 may be made of CMOS (complementary metal oxide semiconductor) and the output stage 162 may be made of GaAs (gallium arsenide), e.g., on a hybrid CMOS/GaAs chip. In this case, the impedances may be quite different and the highest turn ratio may be designed to transform impedances to match the input stage impedance with the output stage impedance. Further, tap $138_1$ provides the highest turns ratio for a bypass mode (i.e., bypassing any power amplifiers) of the power amplification circuit 110 and is chosen to provide the highest power for the bypass modes such that any other bypass-mode turns ratios may be selected without requiring additional circuitry space (e.g., for another winding). Further still, the positions of the taps 136, 138 may be set to help with layout of the power amplification circuit 110 and may be set to provide very accurate desired turns ratios. The transformer 118, particularly in view of the positions of the various taps 136, 138, provide inter-stage matching between the input stage 160 and the output stage 162, e.g., between the DA 116 and the PAs 124. While three taps 138 and corresponding paths are illustrated, there may be more or less than three taps 138 and/or corresponding paths.

Each of the switches 120 is coupled to a respective one of the taps 136 and to a respective one of the PAs 124. Here, there are n of the taps 136, the switches 120, and the PAs 124, with n being any integer over one. Alternatively, in one or more other example amplification circuits, there may be only one switch 120 and only one PA 124, or even no PA 124. The switches 120 are configured to selectively couple (i.e., to couple or not couple) a respective one of the taps 136 to a respective one of the PAs 124. For example, the switch $120_1$ may couple (e.g., connect) the tap $136_1$ to the PA $124_1$ or isolate or uncouple (e.g., disconnect) the tap $136_1$ from the PA $124_1$ in response to a control signal from the controller 134.

The PAs 124 are configured to receive input power from a corresponding one of the taps 136, amplify the input power into output power, and output the output power. Each of the PAs $124_1$-$124_n$ may be different, e.g., present a different input impedance, have a different transfer characteristic, etc., or one or more sets, of two or more of the PAs 124 per set, may have PAs that are the same. Each of the PAs 124 has performance characteristics that, in combination with at least one power configuration of the DA 116, provide a desired output power from the PA 124 corresponding to a different power mode of the amplification circuit 110. Here, for example, the PA $124_1$ in combination with a corresponding power configuration of the DA 116 will provide high power for a high-power mode 1 (HPM1) while the PA $124_n$ in combination with a corresponding power configuration of the DA 116 (that may be the same or different than the configuration used with the PA 124₁) will provide high power for a high-power mode n (HPMn). The multiple high-power modes may be for different communication technologies such as GSM or LTE.

The OMs 126 are configured to transform an output impedance presented by the respective PA 124 into an output impedance that is well-matched to a load coupled to the output 132. Equivalently, the OMs 126 are configured to transform an input impedance presented by the load to the respective PA 124 for appropriate impedance at a corresponding, e.g., maximum, power level. Alternatively, each the OMs 126 could be disposed between the secondary winding 142 and a respective one of the PAs 124 to match an impedance presented by the secondary winding 142 to the PA 124 (transform the impedance presented by the secondary winding 142 to the impedance presented by the PA 124) or, equivalently, match an impedance presented by the PA 124 to the secondary winding 142 (transform the impedance presented by the PA 124 to the impedance presented by the secondary winding 142). In some embodiments, an OM (not illustrated) is disposed between the secondary winding 142 and a respective one of the PAs 124, and another OM (e.g., one of the illustrated OMs 126) is disposed at an output of that PA.

Each of the switches 122 is coupled to a respective one of the taps 138 and to the output 132, and each of the switches 128 is coupled to a respective one of the OMs 126 and to the output 132. The switches 122 are configured to respond to a signal from the controller 134 to selectively couple the respective tap 138 to the output 132, i.e., to couple the tap 138 to, or to decouple or isolate (e.g., continue not to couple) the respective tap 138 from, the output 132. The switches 128 are configured to respond to a signal from the controller 134 to selectively couple the respective OM 126 to the output 132, i.e., to couple the OM 126 to, or to decouple or isolate (e.g., continue not to couple) the respective OM 126 from, the output 132. For example, the controller 134 is configured to cause a switch 128 to couple the respective OM 126 to the output 132 if the controller 134 also causes a corresponding one of the switches 120 to couple a tap 136 to the PA 124 that is coupled to the OM 126 to which the switch 128 is coupled. For example, as shown, the controller 134 is configured to cause both the switch 120₁ and the switch 128₁ to close at any one time or neither to close. Further, the controller 134 may be configured to cause only one of the switches 120, 122 to be closed at a time. Thus, the switches 120, 122, 128, 130 and the controller 134 may be configured such that only one of the taps 136, 138 is coupled to the output 132 at a time, i.e., no more than one of the taps 136, 138 is coupled to the output 132 at a time such that there is no time where more than one of the taps 136, 138 is coupled to the output 132. In some embodiments, the switch 130 is omitted.

While in the example amplification circuit 110 shown in FIG. 4, each tap 136 is selectively coupled to a dedicated PA 124, that is, each of the taps 136 can only be coupled to a corresponding one of the PAs 124, and never a different one of the PAs 124, this is not required. For example, a single tap from a secondary winding may be selectively coupled to one of multiple power amplifiers, or a single tap may be coupled to one or more power amplifiers or to the output independent of any amplifier. Further, a single amplification circuit may include one or more taps that may each be selectively coupled to only a dedicated power amplifier, one or more taps that may be selectively coupled to multiple power amplifiers, and/or one or more taps that may be selectively coupled to one or more power amplifiers or to an output without going through an amplifier.

Figure 5:
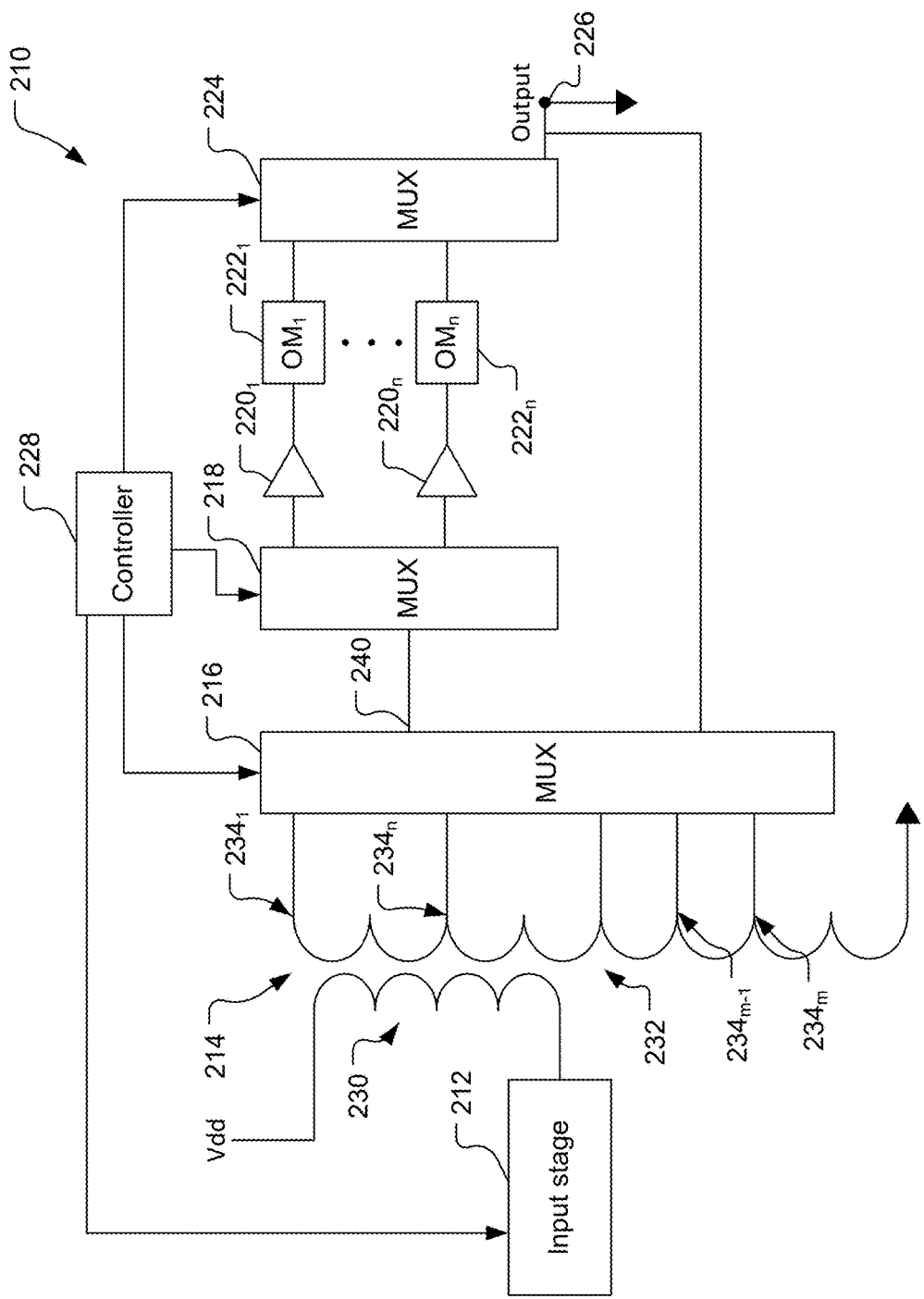
FIG. 5 is a block diagram of components of another example of the power amplification circuit shown in FIG. 3.

Referring to FIG. 5, with further reference to FIGS. 1-4, a power amplification circuit 210, which is another example of the power amplification circuit 66 of the front-end circuitry 34, includes an input stage 212, a transformer 214, a multiplexer 216 (MUX), a multiplexer 218, power amplifiers 220, output-matching circuits 222, a multiplexer 224, an output 226, and a controller 228. The input stage 212 may be configured similarly to the input stage 160 shown in FIG. 4. The PAs 220 and the OMs 222 may be configured similarly to the PAs 124 and the OMs 126 shown in FIG. 4. The transformer 214 includes a primary winding 230 and a secondary winding 232, with the secondary winding 232 (output winding) being a multi-tap winding with taps 234. As shown in this example, there are n PAs 220, n OMs 222, and m taps 234, with m being greater than n by a number of possible connections from the secondary winding 232 to the output 226 that do not include a power amplifier. In this example, the power amplification circuit 210 may be configured to provide one-to-many connections, e.g., to respond to control signals from the controller 228 to couple the same tap 234 to different PAs 220 at different times, or to one or more PAs 220 (one at a time) or to the output 232 independent of any amplifier. Also or alternatively, the power amplification circuit 210 may be configured to implement many-to-one connections, e.g., such that different taps 234 could be connected, one at a time, to the same PA 220 or to the output 232 independent of (without going through) any amplifier. To implement the one-to-many and/or many-to-one functionality, the controller 228 is configured to control the MUXes 216, 218, 224 appropriately. For example, the MUX 216 may selectively couple, in response to a signal from the controller 228, a selected one of the taps 234 to the MUX 218 via a connection 240, or to the output 226. Which taps 234 the MUX 216 may connect to the MUX 218 may be limited, e.g., to the taps 234₁-234ₙ, or not. The MUX 218 may selectively couple, in response to a signal from the controller 228, the connection 240 to an appropriate PA 220. The controller 228 is configured to control the MUXes 216, 218 such that only a selected connection of one of the taps 234 to one of the PAs 220 is made at any one time. The MUX 224 may selectively couple, in response to a signal from the controller 228, an appropriate OM 222 (i.e., one presently receiving a signal from one of the PAs 220) to the output 226. Each of the MUXes 216, 224 is preferably configured to connect only one of its respective inputs to the MUX 216, 224 to its output at a time and the MUX 218 is preferably configured to connect its input to only one of its outputs at a time. The power amplification circuit 210 could be configured to operate similarly to the power amplification circuit 110, e.g., by appropriate programming of the controller 228. In some embodiments, the MUXes 216 and 218 are replaced by the switches 120 and 122. In other embodiments, the MUX 224 is replaced by the switches 128 and/or 130.

Figure 6:
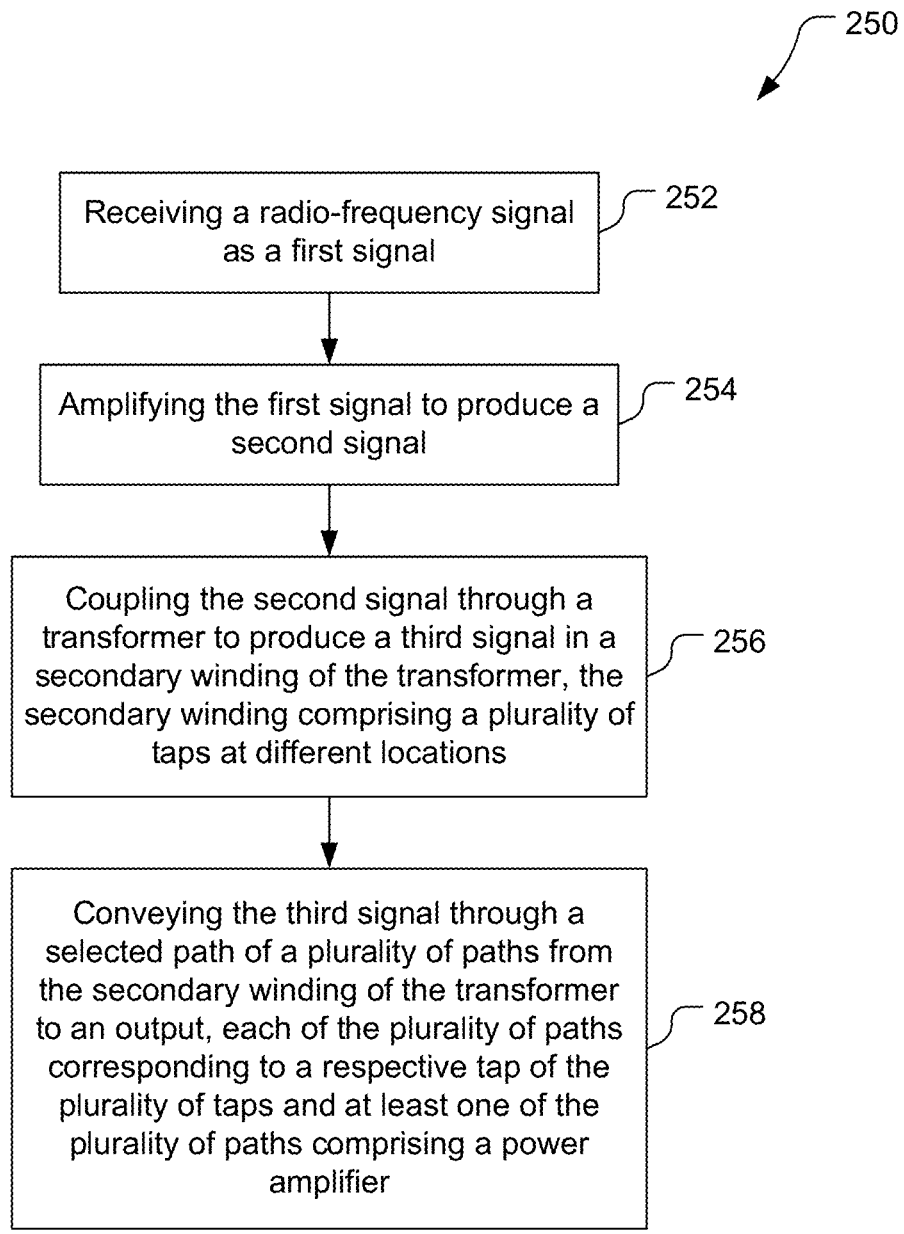
FIG. 6 is a block flow diagram of a method of providing a signal to a load.

Referring to FIG. 6, with further reference to FIGS. 1-5, a method 250 of providing a signal to a load includes the stages shown. The method 250 is, however, an example only and not limiting. The method 250 may be altered, e.g., by having stages added, removed, rearranged, combined, performed concurrently, and/or having single stages split into multiple stages. The method 250 may amplify a communication signal received from the signal processor 32 and provide an amplified communication signal to the antenna element 60.

At stage 252, the method 250 includes receiving a radio-frequency signal as a first signal. For example, the input stage 160 receives a signal from the signal processor 32 via the transceiver 68.

At stage 254, the method 250 includes amplifying the first signal to produce a second signal. For example, the DA 116 amplifies the signal from the transceiver 68 and provides the amplified signal to the transformer 118 and in particular to the primary winding 140 of the transformer 118. The DA 116 may amplify the signal from the transceiver 68 using a selected set of driver amplifier cells to produce the amplified signal.

At stage 256, the method 250 includes coupling the second signal through a transformer to produce a third signal in a secondary winding of the transformer, the secondary winding comprising a plurality of taps at different locations. For example, the transformer 118 couples the signal output by the DA 116 from the primary winding 140 to the secondary winding 142. The transformer 118 transforms the signal from the DA 116 into a transformed signal in the secondary winding 142.

At stage 258, the method 250 includes conveying the third signal through a selected path of a plurality of paths from the secondary winding of the transformer to an output, each of the plurality of paths corresponding to a respective tap of the plurality of taps and at least one of the plurality of paths comprising a power amplifier. For example, the controller 134 causes one of the switches 120, 122 to close, and if one of the switches 120 is closed, then a corresponding one of the switches 128 (the two switches 120, 128 being a pair of switches) to close, to couple a corresponding tap 136, 138 of the secondary winding 142 to the output 132. Closing a pair of the switches 120, 128 causes the third signal to be conveyed through one of the PAs 124 and one of the OMs 126 to the output 132, while closing one of the switches 122 causes the third signal to be conveyed directly to the output 132, without passing through any of the PAs 124 or any of the OMs 126. For example, the controller 134 may cause the switches $120_1$, $128_1$ to close, thereby connecting the tap $136_1$ to the PA $124_1$ and connecting the OM $126_1$ to the output 132, effectively coupling the tap $136_1$ to the output 132, here via the PA $124_1$ and the OM $126_1$. In this case, the third signal is amplified by the PA $124_1$ to produce a fourth signal and processed by the OM $126_1$ to produce a fifth signal before reaching the output 132. Alternatively, as an example, the controller 134 may cause the switch $122_2$ to close, thereby connecting the tap $138_2$ directly to the output 132. In this case, the third signal is not amplified by any of the PAS 124 before reaching the output 132 although the signal may pass through one or more non-amplifying components. As another example, the third signal may be conveyed via a path provided by one or more of the MUXes 216, 218, and/or 224 from one of the taps 234 to the output 226. Depending on the path selected, the third signal may be amplified by one of the PAs 220 to produce a fourth signal and processed by one of the OMs 222 to produce a fifth signal before reaching the output 132.

Other Considerations

Outbound RF communication signals and inbound RF communication signals are discussed as being sent and/or received. These signals may be sent or received one at a time, and the circuits for doing so may be configured accordingly. For example, the LNA 64 may receive and amplify a single inbound RF communication signal at any one time. As another example, the power amplification circuitry 66 may receive and amplify a single output RF communication signal at any one time. Thus, while the plural "signals" is often used when discussing the RF communication signals, this includes the use of the singular "signal" as the use of "signals" may refer to different single RF communication signals over time. Similarly, the use of the single "signal" does not exclude a plurality of "signals," but may be inclusive thereof.

Also, as used herein, "or" as used in a list of items prefaced by "at least one of" or prefaced by "one or more of" indicates a disjunctive list such that, for example, a list of "at least one of A, B, or C," or a list of "one or more of A, B, or C" means A or B or C or AB or AC or BC or ABC (i.e., A and B and C), or combinations with more than one feature (e.g., AA, AAB, ABBC, etc.).

As used herein, unless otherwise stated, a statement that a function or operation is "based on" an item or condition means that the function or operation is based on the stated item or condition and may be based on one or more items and/or conditions in addition to the stated item or condition.

Further, an indication that information is sent or transmitted, or a statement of sending or transmitting information, "to" an entity does not require completion of the communication. Such indications or statements include situations where the information is conveyed from a sending entity but does not reach an intended recipient of the information. The intended recipient, even if not actually receiving the information, may still be referred to as a receiving entity, e.g., a receiving execution environment. Further, an entity that is configured to send or transmit information "to" an intended recipient is not required to be configured to complete the delivery of the information to the intended recipient. For example, the entity may provide the information, with an indication of the intended recipient, to another entity that is capable of forwarding the information along with an indication of the intended recipient.

A wireless communication system is one in which communications are conveyed wirelessly, i.e., by electromagnetic and/or acoustic waves propagating through atmospheric space rather than through a wire or other physical connection. A wireless communication network may not have all communications transmitted wirelessly, but is configured to have at least some communications transmitted wirelessly.

Substantial variations may be made in accordance with specific requirements. For example, customized hardware might also be used, and/or particular elements might be implemented in hardware, software (including portable software, such as applets, etc.) executed by a processor, or both. Further, connection to other computing devices such as network input/output devices may be employed.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional stages or functions not included in the figure. Furthermore, examples of the methods may be implemented by hardware, software, firmware, middleware, microcode, hardware description languages, or any combination thereof. When implemented in software, firmware, middleware, or microcode, the program code or code segments to perform the tasks may be stored in a non-transitory computer-readable medium such as a storage medium. Processors may perform the described tasks.

Components, functional or otherwise, shown in the figures and/or discussed herein as being connected or communicating with each other are communicatively coupled. That is, they may be directly or indirectly connected to enable communication between them.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

Further, more than one invention may be disclosed.

The invention claimed is:

1. An amplification circuit comprising:
an input stage including a driver;
a transformer that includes a primary winding and a secondary winding, the primary winding being coupled to an output of the driver, the driver being configured to provide a selectable amount of power from a plurality of selectable power levels to the transformer responsive to a control signal; and
an output stage including:
an output configured to be coupled to a load; and
a plurality of paths coupled to the output and coupled to respective taps of the secondary winding;
wherein at least one of the plurality of paths comprises a power amplifier.

2. An amplification circuit comprising:
an input stage including a driver;
a transformer that includes a primary winding and a secondary winding, the primary winding being coupled to an output of the driver; and
an output stage including:
an output configured to be coupled to a load; and
a plurality of paths coupled to the output and coupled to respective taps of the secondary winding;
wherein at least one of the plurality of paths comprises a power amplifier, and
wherein the plurality of paths comprises:
a first path coupled to the secondary winding at a first tap, the first path including the power amplifier; and
a second path coupled to the secondary winding at a second tap, the second path being configured to couple the second tap directly to the output;
wherein there is less of the secondary winding between the second tap and a last terminal of the secondary winding than between the first tap and the last terminal of the secondary winding.

3. The amplification circuit of claim 2, wherein the power amplifier is a first power amplifier, the output stage further comprises a third path coupled to the secondary winding at a third tap, the third path includes a second power amplifier, and wherein there is less of the secondary winding between the first tap and the last terminal of the secondary winding than between the third tap and the last terminal of the secondary winding.

4. The amplification circuit of claim 2, wherein the output stage further comprises a third path coupled to the secondary winding at a third tap, the third path being configured to couple the third tap directly to the output, and wherein there is less of the secondary winding between the third tap and the last terminal of the secondary winding than between the second tap and the last terminal of the secondary winding.

5. The amplification circuit of claim 1, wherein the output stage further comprises an output-matching circuit coupled between the power amplifier and the output, or coupled between the secondary winding and the power amplifier.

6. The amplification circuit of claim 1, wherein the driver is a CMOS driver and the output stage comprises GaAs.

7. An amplification circuit comprising:
an input stage including a driver;
a transformer that includes a primary winding and a secondary winding, the primary winding being coupled to an output of the driver; and
an output stage including:
an output configured to be coupled to a load; and
a plurality of paths coupled to the output and coupled to respective taps of the secondary winding;
wherein at least one of the plurality of paths comprises a power amplifier, and
wherein the output stage is configured to couple only one of the respective taps to the output at a time.

8. The amplification circuit of claim 1, wherein the driver is configured to provide a selectable power to the primary winding of the transformer such that a single path is provided between an input of the driver and the primary winding of the transformer for a plurality of different selectable output powers of the driver.

9. The amplification circuit of claim 8, wherein the driver comprises an impedance matching circuit coupled to the driver and disposed in the single path between the input of the driver and the primary winding of the transformer, wherein the impedance matching circuit is configured to provide a selectable impedance and to select an impedance to match based on an impedance selection input.

10. The amplification circuit of claim 8, wherein the driver comprises a plurality of selectable amplifier cells and the driver is configured to selectively activate one or more of the plurality of selectable amplifier cells to provide each of the different selectable output powers.

11. The amplification device of claim 1, wherein at least one of plurality of paths is implemented at least in part by a portion of a multiplexer.

12. An amplification circuit comprising:
an input stage including a driver;
a transformer that includes a primary winding and a secondary winding, the primary winding being coupled to an output of the driver; and
an output stage including:
   an output configured to be coupled to a load; and
   a plurality of paths coupled to the output and coupled to respective taps of the secondary winding;
wherein at least one of the plurality of paths comprises a power amplifier, and
further comprising a variable capacitor coupled to an output of the driver and to a feed terminal of the primary winding.

13. An amplification circuit comprising:
driving means for providing drive energy;
a transformer that includes a primary winding and a secondary winding, the primary winding being coupled to the driving means to receive the drive energy, the driving means being configured to provide a selectable amount of power from a plurality of selectable power levels to the transformer responsive to a control signal; and
coupling means for selectively coupling the secondary winding to an output that is configured to be coupled to a load, the coupling means comprising a plurality of paths each configured to selectively couple a respective tap, of a plurality of taps of the secondary winding, to the output, at least one of the paths including amplifying means for amplifying energy from the secondary winding.

14. An amplification circuit comprising:
driving means for providing drive energy;
a transformer that includes a primary winding and a secondary winding, the primary winding being coupled to the driving means to receive the drive energy; and
coupling means for selectively coupling the secondary winding to an output that is configured to be coupled to a load, the coupling means comprising a plurality of paths each configured to selectively couple a respective tap, of a plurality of taps of the secondary winding, to the output, at least one of the paths including amplifying means for amplifying energy from the secondary winding,
wherein the plurality of paths comprises:
   a first path coupled to the secondary winding at a first tap of the plurality of taps, the first path including the amplifying means; and
   a second path coupled to the secondary winding at a second tap of the plurality of taps, the second path being configured to couple the second tap directly to the output;
wherein there is less of the secondary winding between the second tap and a last terminal of the secondary winding than between the first tap and the last terminal of the secondary winding.

15. The amplification circuit of claim 14, wherein the amplifying means are first amplifying means and wherein the coupling means further comprise a third path coupled to the secondary winding at a third tap of the plurality of taps, the third tap being distinct from the first tap and the second tap, and the third path comprising second amplifying means for amplifying energy from the secondary winding.

16. The amplification circuit of claim 14, wherein the coupling means further comprise a third path coupled to the secondary winding at a third tap of the plurality of taps, the third tap being distinct from the first tap and the second tap, the third path being configured to couple the second tap directly to the output, and wherein there is less of the secondary winding between the third tap and the last terminal of the secondary winding than between the first tap and the last terminal of the secondary winding.

17. The amplification circuit of claim 14, wherein the coupling means comprise means for matching an output coupled between the amplifying means and the output or between the first tap of the secondary winding and the amplifying means.

18. An amplification circuit comprising:
driving means for providing drive energy;
a transformer that includes a primary winding and a secondary winding, the primary winding being coupled to the driving means to receive the drive energy; and
coupling means for selectively coupling the secondary winding to an output that is configured to be coupled to a load, the coupling means comprising a plurality of paths each configured to selectively couple a respective tap, of a plurality of taps of the secondary winding, to the output, at least one of the paths including amplifying means for amplifying energy from the secondary winding, wherein the coupling means are for coupling only one of the plurality of taps to the output at a time.

19. The amplification circuit of claim 13, wherein the driving means comprise a CMOS driver and the coupling means comprise GaAs.

20. The amplification circuit of claim 13, wherein the driving means are for providing the drive energy with a selectable power to the primary winding of the transformer such that a single path is provided between an input of the driving means and the primary winding of the transformer for a plurality of different selectable output powers.

21. The amplification circuit of claim 20, wherein the driving means comprise means for matching an impedance disposed in the single path between the input of the driving means and the primary winding of the transformer, wherein the means for matching an impedance includes means for providing a selectable impedance and means for selecting an impedance to match based on an impedance selection input.

22. A method of providing a signal to a load, the method comprising:
   receiving a radio-frequency signal as a first signal;
   amplifying the first signal to produce a second signal;
   coupling the second signal through a transformer to produce a third signal in a secondary winding of the transformer, the secondary winding comprising a plurality of taps at different locations, wherein coupling the second signal through the transformer further comprises coupling only one of the plurality of taps to the output at a time; and
   conveying the third signal through a selected path of a plurality of paths from the secondary winding of the transformer to an output, each of the plurality of paths corresponding to a respective tap of the plurality of taps and at least one of the plurality of paths comprising a power amplifier.

23. The method of claim 22, further comprising amplifying the third signal with the power amplifier to produce a fourth signal.

24. The method of claim 23, further comprising processing the fourth signal in an output-matching circuit to produce a fifth signal, and providing the fifth signal to the output.

25. The method of claim 22, wherein amplifying the first signal comprises amplifying the first signal using a selected set of a plurality of driver amplifier cells to produce the second signal.

\* \* \* \* \*